United States Patent [19]

Bowles

[11] Patent Number: 5,166,608
[45] Date of Patent: Nov. 24, 1992

[54] ARRANGEMENT FOR HIGH SPEED TESTING OF FIELD-EFFECT TRANSISTORS AND MEMORY CELLS EMPLOYING THE SAME

[75] Inventor: James E. Bowles, Austin, Tex.

[73] Assignee: Advanced Micro Devices, Inc., Sunnyvale, Calif.

[21] Appl. No.: 788,819

[22] Filed: Nov. 7, 1991

[51] Int. Cl.$^5$ ............................................. G01R 31/28
[52] U.S. Cl. .............................. 324/158 T; 324/158 R; 365/201
[58] Field of Search .............. 324/23.1, 158 R, 158 T; 365/201; 307/350; 371/21.4

[56] References Cited

U.S. PATENT DOCUMENTS

| | | | |
|---|---|---|---|
| 3,795,859 | 3/1974 | Benante et al. | 324/158 T |
| 3,995,215 | 11/1976 | Chu et al. | 324/158 T |
| 4,502,140 | 2/1985 | Proebsting | 365/201 |
| 4,612,630 | 9/1986 | Rosier | 365/201 |
| 4,789,825 | 12/1988 | Carelli et al. | 324/158 T |
| 4,801,869 | 1/1989 | Sprogis | 324/158 R |
| 4,835,458 | 5/1989 | Kim | 324/158 R |
| 4,879,690 | 11/1989 | Anami et al. | 365/201 |
| 5,022,008 | 6/1991 | Shreck et al. | 365/201 |
| 5,097,206 | 3/1992 | Perner | 324/158 R |

OTHER PUBLICATIONS

"Circuit for Facilitating the Testing of Semiconductor Chips Mounted on a Module", by Abilevitz et al., IBM Tech. Disc. Bull., vol. 22, #2, pp. 1018-1021, Aug. 1979.

Primary Examiner—Jack B. Harvey
Assistant Examiner—William J. Burns
Attorney, Agent, or Firm—Foley & Lardner

[57] ABSTRACT

A testing circuit for testing field-effect transistors of, for example, a random access memory includes weak N-channel pull-down field-effect transistors and weak P-channel pull-up field-effect transistors for testing field-effect transistors of opposite type to be tested. The weak field-effect transistors are placed in series with the opposite type of field-effect transistors. When the series coupled field-effect transistors are turned on, the voltage at the common node of the field-effect transistors is sensed to determine whether the common node is pulled-up or pulled-down in potential to indicate whether a field-effect transistor under test is functional.

30 Claims, 2 Drawing Sheets

ARRANGEMENT FOR HIGH SPEED TESTING OF FIELD-EFFECT TRANSISTORS AND MEMORY CELLS EMPLOYING THE SAME

BACKGROUND OF THE INVENTION

The present invention relates to an arrangement for testing field-effect transistors. The present invention more particularly relates to such an arrangement which may be utilized to advantage for testing and locating defective field-effect transistors utilized in the memory cells of random access memory arrays.

Each memory cell of a random access memory generally includes six field-effect transistors. Four of the field-effect transistors, two pull-up field-effect transistors and two pull-down field-effect transistors, form a cross coupled latch well known in the art for maintaining logic ones or zeros in storage. Each cell is associated with a unique combination of a row conductor and a pair of column conductors. Each column conductor is coupled through a pass field-effect transistor to one side of the cross coupled latch. The gates of the pass field-effect transistors are also coupled to the associated row conductors. When a memory cell is accessed, the pass field-effect transistors are rendered conductive by a voltage applied to the pass field-effect transistor gates through the associated row conductor. For a read access, a sense amplifier senses the voltage potential across the associated pair of column conductors. For a write access, suitable voltages are applied to the associated pair of column conductors to set the cross coupled latch to the proper state.

Obviously, all of the memory cells of a memory array must be tested by its manufacturer prior to its shipment and eventual use. This requires the testing of the pull-up and pull-down field-effect transistors of the memory cell cross coupled latches.

Such memory cells have been traditionally tested by writing logical ones into all of the memory cells and then reading each cell to determine if the pull-up field-effect transistor on one side of the latch and the pull-down field-effect transistor on the other side of the latch are functioning properly. Then, a logical zero is written into all of the memory cells and again each cell is read to determine if the opposite combination of pull-up and pull-down field-effect transistors are functioning properly. Each time the memory cell is written into, a wait period is required to allow for any capacitive charge resulting from a defective transistor to dissipate. Otherwise, a pull-up field-effect transistor may appear to be functioning properly when, in fact, it is defective. Locating a faulty pull-down field-effect transistor by this approach is even more difficult because a defective pull-down field-effect transistor may appear to be functioning properly.

The traditional approach of testing the field-effect transistors in random access memory arrays has thus exhibited serious shortcomings. Considerable time, on the order of seconds, is required to test an average sized array. Also, even after such testing, it is not always assured that all defective cells have been located.

SUMMARY OF THE INVENTION

The present invention therefore provides an arrangement for testing the operability of a field-effect transistor to be tested. The arrangement includes a second field-effect transistor coupled in series relation to the field-effect transistor to be tested to form a series combination of the field-effect transistors. The second field-effect transistor is opposite in type with respect to the field-effect transistor to be tested and has a lower current sourcing capability than the field-effect transistor to be tested. The arrangement further includes a first voltage source coupled to one of the field-effect transistors and a second voltage source coupled to the other one of the field-effect transistors. The first and second voltage sources provide a potential difference across the series combination of the field-effect transistors. The arrangement further includes means for applying coincident turn-on potentials to the field-effect transistors, and sensing means having a sensing input coupled between the field-effect transistor to be tested and the second field-effect transistor for sensing the potential at the sensing input when the turn-on potentials are coincidently applied to the field-effect transistors.

The present invention further provides an arrangement for testing the operability of a field-effect transistor to be tested of a memory cell within a memory cell array wherein the memory cell is associated with a row conductor and at least one column conductor and wherein the field-effect transistor to be tested is coupled between a first source of fixed potential and the column conductor. The arrangement includes a second source of fixed potential and a second field-effect transistor coupled between the column conductor and the second source of fixed potential to form a series combination of the field-effect transistor to be tested and the second field-effect transistor between the first and second sources of fixed potential. The second field-effect transistor is of opposite type with respect to the field-effect transistor to be tested and has a lower current sourcing capability than the field-effect transistor to be tested. The arrangement further includes means for applying coincident turn-on potentials to the field-effect transistor to be tested and the second field-effect transistor and sensing means having a sensing input coupled to the column conductor between the field-effect transistor to be tested and the second field-effect transistor for sensing the potential at the sensing input when the turn-on potentials are coincidently applied to the field-effect transistors.

The present invention still further provides an arrangement for testing the operability of P and N-channel field-effect transistors in a memory array of the type including a plurality of memory cells arranged in rows and columns, wherein each memory cell is associated with a unique combination of row conductor and a pair of first and second column conductors, and wherein each memory cell includes a cross coupled latch having first and second sides with each side including series coupled P and N-channel field-effect transistors and a pass transistor having a control gate coupled to the associated row conductor and being coupled between a respective one of the column conductors and the common junction of the series coupled P and N-channel field-effect transistors. The arrangement includes sensing means associated with each column of memory cells, the sensing means including a first input coupled to the first column conductor of the pair of column conductors and a second input coupled to the second column conductor of the pair of column conductors for sensing the potential difference between the first and second column conductors. The arrangement further includes a first weak P-channel field-effect transistor coupled to the sensing means first input, a first weak N-channel field-effect transistor coupled to the sensing means first input, a second weak P-channel field-effect transistor coupled to the sensing means second input, and second weak N-channel field-effect transistor coupled to the sensing means second input. The weak P-channel field-effect transistors have a lower current sourcing capability than the memory cell N-channel field-effect transistors and the weak N-channel field-effect transistors have a lower current sourcing capability than the memory cell P-channel field-effect transistors. The arrangement further includes a first transfer gate coupling the sensing means first input to the first column conductor and a second transfer gate coupling the sensing means second input to the second column conductor.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DESCRIPTION OF THE PREFERRED EMBODIMENTS

Figure 1:
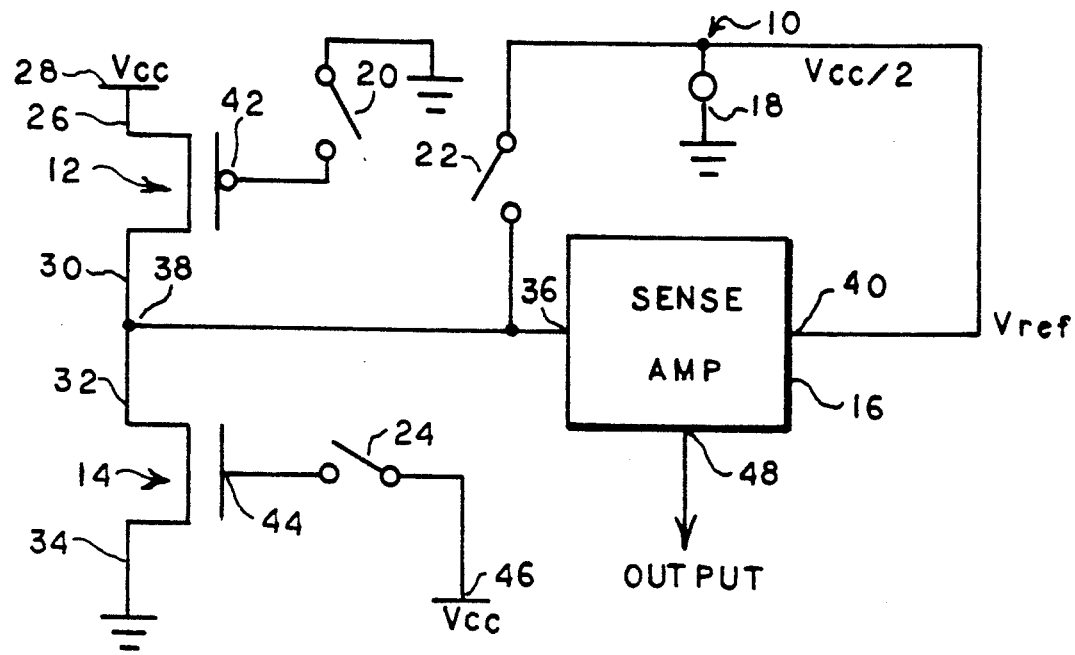
FIG. 1 is a schematic circuit diagram of an arrangement for testing a P-channel field-effect transistor in accordance with the present invention.

Referring now to FIG. 1, it illustrates an arrangement in schematic circuit diagram form embodying the present invention for testing the operability of a P-channel field-effect transistor to be tested 12. The arrangement 10 generally includes a second field-effect transistor 14, a sense amplifier 16, a reference voltage source 18, and switches 20, 22, and 24.

The source 26 of field-effect transistor 12 is coupled to a positive voltage source ($V_{cc}$) at terminal 28. The drain 30 of transistor 12 is coupled to the drain 32 of transistor 14. The source 34 of transistor 14 is coupled to ground potential. As can thus be seen, the field-effect transistor to be tested 12 and transistor 14 are coupled in series to form a series combination between voltage source terminal 28 and ground potential.

The transistor 14 comprises a second transistor which is of opposite type with respect to the P-channel field-effect transistor 12. To that end, field-effect transistor 14 is an N-channel field-effect transistor. In addition, field-effect transistor 14 is a weak transistor as compared to field-effect transistor 12. In other words, the N-channel field-effect transistor 14 has a lower current sourcing capability than the P-channel field-effect transistor to be tested 12. The P-channel field-effect transistor 12 is configured to source at least ten times more current than the N-channel field-effect transistor 14. Preferably, field-effect transistor 12 is capable of sourcing ten times more current than the field-effect transistor 14.

Sense amplifier 16 includes a first input 36 coupled between field-effect transistor 12 and field-effect transistor 14 at a node 38. Sense amplifier 16 includes a second input 40 which is coupled to the reference potential source 18. The reference potential source 18 preferably provides a reference voltage of one-half the potential difference across the series combination of the field-effect transistors 12 and 14. Hence, reference voltage source 18 provides a reference voltage of:

$$\frac{V_{cc}}{2}$$

The switch 20 couples the gate 42 of P-channel field-effect transistor 12 to ground when the switch 20 is closed. The switch 24 couples the gate 44 of the N-channel field-effect transistor 14 to $V_{cc}$ at a terminal 46 when the switch 24 is closed. The switch 22 couples the reference potential source 18 to the input 36 of sense amplifier 16 when switch 22 is closed. The switch 22 is provided for precharging the input 36 of sense amplifier 16 to the reference voltage potential immediately before the field-effect transistor 12 is placed under test.

In operation, switches 20 and 22 are closed for turning field-effect transistor 12 on and precharging the input 36 of sense amplifier 16 to the reference voltage. When the field-effect transistor 12 is to be tested, switch 22 is opened and switch 24 is closed. When switch 24 is closed, the N-channel field-effect transistor 14 is turned on.

At this point in time, the sense amplifier 16 senses the voltage difference between the voltage at its input 36 and the voltage at its reference input 40. If field-effect transistor 12 is functional, it will overdrive the relatively weak field-effect transistor 14 to pull node 38 up to $V_{cc}$. If however field-effect transistor 12 is defective, the relatively weak field-effect transistor 1 will overdrive the field-effect transistor 12 and pull node 38 down to approximately ground potential. If node 38 is pulled up indicating that field-effect transistor 12 is functional, sense amplifier 16 will provide a high level at its output 48. Conversely, if field-effect transistor 12 is defective and node 38 is pulled down by field-effect transistor 14, sense amplifier 16 will provide a low level at its output 48.

The foregoing test procedure can be very fast. More particularly, because the input 36 of the sense amplifier 16 is precharged to one-half the potential difference across field-effect transistors 12 and 14, the node 38 will be quickly pulled either above the reference voltage or below the reference voltage to provide an indication at output 48 as to whether field-effect transistor 12 is functional. Such testing may take, on the order of, thirty-five nanoseconds.

Figure 2:
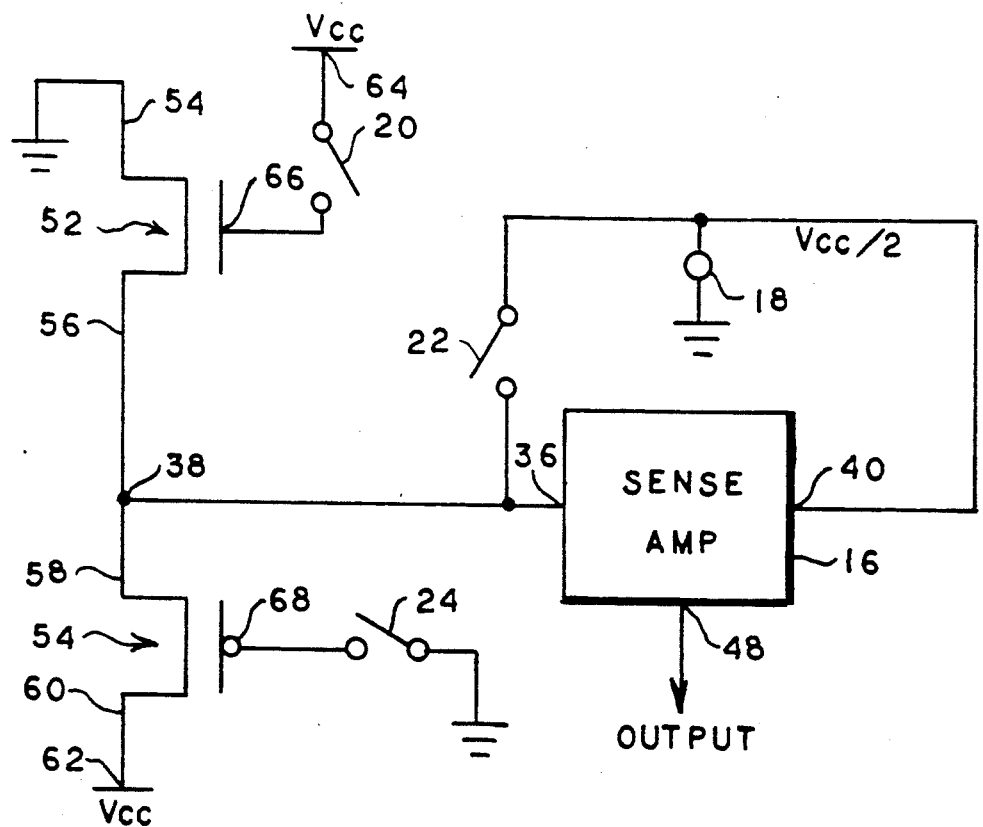
FIG. 2 is a schematic circuit diagram of an arrangement for testing an N-channel field-effect transistor in accordance with the present invention.

Referring now to FIG. 2, it illustrates another arrangement 50 for testing the operability of an N-channel field-effect transistor 52. Like the arrangement of FIG. 1, the arrangement 50 includes the sense amplifier 16, the reference voltage source 18, and switches 20, 22, and 24.

The N-channel field-effect transistor to be tested 52 is coupled in series relation which a weak P-channel field-effect transistor 54. To that end, the source 54 of field-effect transistor 52 is coupled to ground potential, the drain 56 of field-effect transistor 52 is coupled to the drain 58 of field-effect transistor 54, and the source 60 of field-effect transistor 54 is coupled to $V_{cc}$ at terminal 62.

As a result, field-effect transistor 52 and field-effect transistor 54 are coupled in series to form a series combination between the positive voltage source ($V_{cc}$) at terminal 62 and ground potential.

When switch 20 is closed, it applies $V_{cc}$ from terminal 64 to the gate 66 of field-effect transistor to be tested 52. When switch 22 is closed, it, as in the preceding embodiment, precharges input 36 of sense amplifier 16 to the reference voltage potential. When switch 24 is closed it applies ground potential to the gate 68 of field-effect transistor 54.

The P-channel field-effect transistor 54 is configured to source less current than field-effect transistor 52. In accordance with the present invention, field-effect transistor 54 may be configured so that field-effect transistor 52 is capable of sourcing at least five times more current than field-effect transistor 54. Preferably, the field-effect transistors are configured so that field-effect transistor 52 is capable of sourcing nine times the current than field-effect transistor 5 is capable of sourcing. The configuring of the field-effect transistors for sourcing different amounts of current may be achieved in a manner well known in the art.

When field-effect transistor 52 is to be tested switches 20 and 22 are closed. The closing of switch 20 turns field-effect transistor 52 on and the closing of switch 22 precharges input 36 of sense amplifier 16 to the reference voltage potential. Then, switch 22 is opened and switch 24 is closed to turn on the weak P-channel field-effect transistor 54. If field-effect transistor 52 is functional, it will readily overdrive field-effect transistor 54 to pull node 38 down to near ground potential. However, if field-effect transistor 52 is defective, field-effect transistor 54 will readily overdrive field-effect transistor 52 and pull node 38 up to $V_{cc}$. The sense amplifier 16 at its input 36 senses the voltage potential at node 38. If node 38 is pulled down, the output 48 of sense amplifier 16 will provide a low voltage to indicate that field-effect transistor 52 is functional. However, if node 38 is pulled up, sense amplifier 16 will provide at output 48 a high voltage level to indicate that the N-channel field-effect transistor 52 is defective. Like the embodiment of FIG. 1, the field-effect transistor 52 may be tested very quickly in about thirty-five nanoseconds.

Figure 3:
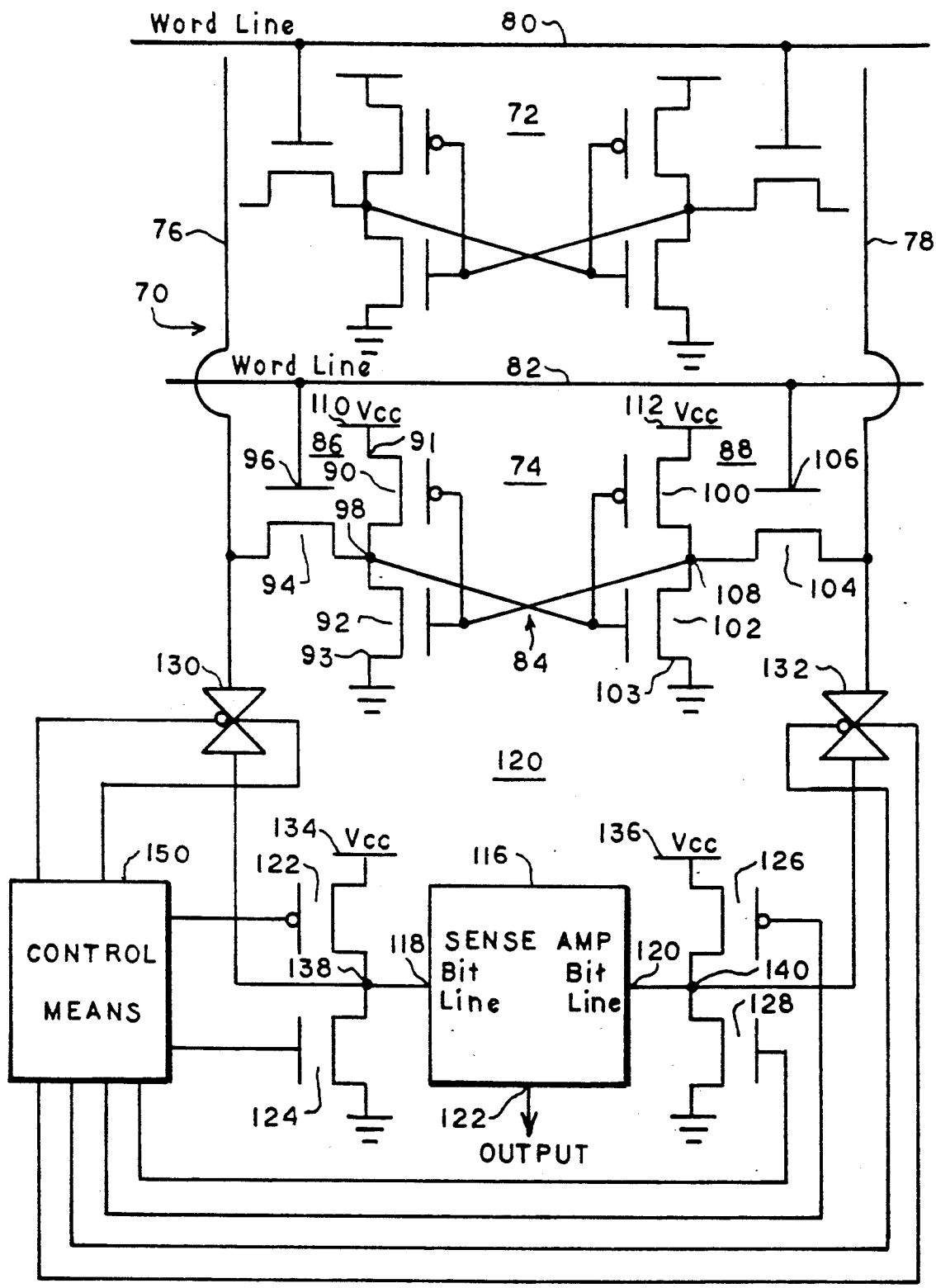
FIG. 3 is a schematic circuit diagram of a partial random access memory array illustrating the manner in which the cross coupled latch field-effect transistors of a memory cell may be tested in accordance with the present invention.

Referring now to FIG. 3, it illustrates, in schematic circuit diagram form, a random access memory embodying the present invention. More specifically, FIG. 3 illustrates the manner in which the present invention may be used to advantage for testing the field-effect transistors of the memory cells of a random access memory.

The random access memory 70 illustrated in FIG. 3 is illustrated as a partial random access memory including memory cells 72 and 74. The memory cells of such random access memories are arranged in an array of rows and columns with each memory cell being associated with a unique combination of a row conductor and a pair of column conductors. The memory cells 72 and 74 illustrated in FIG. 3 are within the same column and are associated with column conductors 76 and 78. The memory cells 72 and 74 are in different rows with memory cell 72 being associated with row conductor 80 and memory cell 74 being associated with row conductor 82. Since the memory cells 72 and 74 are identical, only memory cell 74 will be described in detail herein.

Memory cell 74 includes a cross coupled latch 84 comprising a first side 86 and second side 88. The first side 86 of latch 84 includes series coupled P-channel and N-channel field-effect transistors 90 and 92 respectively and an N-channel field-effect pass transistor 94. The pass transistor 94 includes a gate 96 which is coupled to the row line 82 and is coupled between the column conductor 76 and the common junction 98 of the P and N-channel field-effect transistors 90 and 92.

Similarly, the second side 88 of latch 84 includes series coupled P-channel and N-channel field-effect transistors 100 and 102 respectively and an N-channel pass field-effect transistor 104. The pass transistor 104 includes a gate 106 coupled to the row line 82 and is coupled between the column conductor 78 and the common junction 108 of the series coupled P-channel and N-channel field-effect transistors 100 and 102.

The sources 91 and 101 of P-channel field-effect transistors 90 and 100 respectively are coupled to a positive voltage source ($V_{cc}$) at terminals 110 and 112 respectively. The sources 93 and 103 of N-channel field-effect transistors 92 and 102 respectively are coupled to ground potential. As a result, a potential difference of $V_{cc}$ is applied between the series combinations of transistors 90 and 92 and 100 and 102.

When the memory cell 74 is accessed, a positive potential is applied to the row conductor 82 to cause the pass transistors 94 and 104 to conduct. If the access is write access, suitable potentials are applied to the column conductors 76 and 78 to set the latch 84 into its proper state. For example, if a logical one is written into memory cell 74, a positive potential is applied to column conductor 76 and ground is applied to column conductor 78. This stores a logical one within the memory cell 74 with transistors 90 and 102 turned on and transistors 100 and 92 turned off to provide a high logic level at node 98 and low logic level at node 108. Conversely, if a logical zero is written into memory cell 74, a positive potential is applied to column conductor 78 and ground potential is applied to column conductor 76. This causes transistors 100 and 92 to be turned on and transistors 90 and 102 to be turned off. As a result, the logical zero stored in memory cell 74 is represented by a high logic level at node 108 and low logic level at node 98.

If the access is a read access, the sense amplifier 116 senses the potential difference across the column conductors 76 and 78. If a logical one is stored in memory cell 74, a high logic level will appear at input 118 of sense amplifier 116 and a low logic level will appear at input 120 of sense amplifier 116. This causes the sense amplifier 116 to provide a high logic level output at its output 122. If a logical zero is stored in memory cell 74, a low logic level will appear at input 118 of sense amplifier 116 and a high logic level will appear at input 120 of sense amplifier 116. Sense amplifier 116 will therefore provide a low logic level at its output 122. A sense amplifier identical to sense amplifier 116 is associated with each column of memory cells.

For testing the field-effect transistors of the cross coupled latches of the memory cells associated with the column conductors 76 and 78, the random access memory 70 includes a testing circuit 120 configured in accordance with the present invention. In practice, each column of memory cells is associated with such a testing circuit.

The testing circuit 120 utilizes the sense amplifier 116 and includes a first weak P-channel field-effect transistor (pull-up) 122, a first weak N-channel field-effect transistor (pull-down) 124, a second weak P-channel field-effect transistor (pull-up) 126, and second weak N-channel field-effect transistor (pull-down) 128. The testing circuit 120 further includes a first transfer gate 130 and a second transfer gate 132. The transfer gates 130 and 132 preferably are formed by parallel coupled P-channel and N-channel field-effect transistors in a manner well known in the art.

Transistors 122 and 124 are coupled in series relation between $V_{cc}$ at terminal 134 and ground potential. Similarly, transistors 126 and 128 are coupled in series between $V_{cc}$ at terminal 136 and ground potential. The common junction 138 of transistors 122 and 124 is coupled to input 118 of sense amplifier 116. Similarly, the common junction 140 of transistors 126 and 128 is coupled to the input 120 of sense amplifier 116.

The P-channel field-effect transistors 122 and 126 are configured to source less current than the N-channel field-effect transistors 92 and 102 respectively. In accordance with the present invention, the weak P-channel field-effect transistors 122 and 126 are configured so that the N-channel field-effect transistors are capable of sourcing at least five times more current than the P-channel field-effect transistors 122 and 126. The weak N-channel field-effect transistors 124 and 128 are similarly configured to source less current than the P-channel field-effect transistors 90 and 100 respectively. More specifically, in accordance with the present invention, the weak N-channel field-effect transistors 124 and 128 are configured so that the P-channel field-effect transistors 90 and 100 are capable of sourcing at least ten times more current than the weak N-channel field-effect transistors 124 and 128.

The field-effect transistors of the cross coupled latches of the random access memory cells are tested by the testing circuit 120 under the control of an external control means 150. More specifically, the control means 150 is coupled to field-effect transistors 122, 124, 126, and 128 and the transfer gates 130 and 132 to control the turning on and turning off of these devices.

When the P-channel field-effect transistor 90 of memory cell 74, and all such corresponding P-channel field-effect transistors of all other memory cells are to be tested, the random access memory 70 is first accessed to write into each memory cell a logical one. After a logical one is stored in each memory cell, each P-channel field-effect transistor of each memory cell corresponding to field-effect transistor 90 is tested one at a time in the following manner.

The transfer gates 130 and 132 are turned on by control means 150 and a precharge voltage of one-half $V_{cc}$ is applied to both column conductors 76 and 78 to balance the inputs 118 and 120 of sense amplifier 116. This also assures a positive or negative going transition at input 118 when P-channel field-effect transistor 90 is tested. Next, transfer gate 132 is turned off and the weak N-channel field-effect transistor 124 is turned on by control means 150. At this time, the row conductor 82 is provided with a high level voltage to turn on pass transistor 94. The logical one stored in memory cell 74 causes transistor 90 to be turned on and with N-channel field-effect transistor 124 being turned on by control means 150, these transistors are now coincidently turned on. If the P-channel field-effect transistor 90 is functional, it will readily overdrive the weak N-channel field-effect transistor 124 to pull-up node 138. This is sensed at input 118 by the sense amplifier 116 to cause the sense amplifier 116 to provide a high logic output at output 122 to indicate that the P-channel field-effect transistor 90 is functional. Conversely, if the P-channel field-effect transistor 90 is defective, the weak N-channel field-effect transistor 124 will readily overdrive transistor 90 to pull-down node 138. This is sensed by the sense amplifier 116 at input 118 to cause the sense amplifier 116 to provide a low logic level at output 122 to indicate that transistor 90 is defective. Before each P-channel field-effect transistor corresponding to P-channel field-effect transistor 90 is tested, it is necessary to turn on transfer gates 130 and 132 for precharging the inputs 118 and 120 of sense amplifier 116 to one-half $V_{cc}$.

After all of the P-channel field-effect transistors corresponding to P-channel field-effect transistor 90 have been tested, the N-channel field-effect transistors of all memory cells corresponding to N-channel field-effect transistor 102 may then be tested without having to again write a logical one into all memory cells.

In testing the N-channel field-effect transistors corresponding to N-channel field-effect transistor 102, the transfer gates 130 and 132 are turned on to precharge and balance inputs 118 and 120 of sense amplifier 116. More specifically, when N-channel field-effect transistor 102 is to be tested, transfer gates 130 and 132 are turned on and inputs 118 and 120 are precharged to the precharge reference voltage. Then, transfer gate 130 is turned off, pass transistor 104 is enabled through the row conductor 82, and the weak P-channel field-effect transistor 126 is turned on. If the N-channel field-effect transistor 102 is functional, it will readily overdrive the weak P-channel field-effect transistor 126 to pull-down node 140. This is sensed at input 120 of sense amplifier 116 which provides a low logic level at output 122 to indicate that the N-channel field-effect transistor 102 is functional. Conversely, if the N-channel field-effect transistor 102 is not functional, the weak P-channel field-effect transistor 126 will readily overdrive transistor 102 to pull-up node 140. This will be sensed by the sense amplifier 116 at input 120 to provide a high logic output at output 122 to indicate that the N-channel field-effect transistor 102 is not functional. The same process is repeated for each N-channel field-effect transistor corresponding to N-channel field-effect transistor 102.

For testing the P-channel field-effect transistor 100 and all such P-channel field-effect transistors corresponding thereto and N-channel field-effect transistor 92 and all such corresponding N-channel field-effect transistors, the same procedure as described above is repeated. However, before such testing, a logical zero is first written into each memory cell. For example, for testing such transistors of the column defined by column conductors 76 and 78, a logical zero is written into each memory cell of that column by providing a high logic level to column conductor 78 and a low logic level to column conductor 76. Thereafter, the testing may proceed as described above.

In testing the field-effect transistors of the cross coupled latches of the random access memory 70, it has been found that such testing can occur very rapidly. More specifically, the testing of each such field-effect transistor has been found to require approximately thirty-five nanoseconds. This represents considerable savings in time for testing a random access memory as compared to the conventional method previously referred to.

Another important advantage provided by the present invention is that the testing circuitry associated with each column of memory cells may be tested before the cross coupled latch field-effect transistors are tested.

The testing of the testing circuitry may be accomplished in the following manner with reference to testing circuit 120 of the column of memory cells associated with column conductors 76 and 78.

Each of the weak field-effect transistors 122, 124, 126, and 128 are tested one at a time. To test field-effect transistor 122, for example, transfer gates 130 and 132 are turned on and inputs 118 and 120 of sense amplifier 116 are precharged to the reference voltage potential of one-half $V_{cc}$. Thereafter, the transfer gates 130 and 132 are turned off and a turn-on potential is applied to transistor 122. If transistor 122 is functional, it will pull-up node 138 and will be sensed at input 118 of sense amplifier 116. Conversely, if transistor 122 is defective, it will not pull-up node 138. The P-channel field-effect transistor 126 may be tested in the same manner.

For testing N-channel field-effect transistor 124, transfer gates 130 and 132 are again turned one and inputs 118 and 120 are precharged. Thereafter, transfer gates 130 and 132 are turned off and a turn-on potential is applied to N-channel field-effect transistor 124. If N-channel field-effect transistor 124 is functional, it will pull-down node 138 to be sensed at input 118 of sense amplifier 116. However, if N-channel field-effect transistor 124 is defective node 138 will not be pulled-down. The N-channel field-effect transistor 128 may be tested in the same manner.

After the testing procedure is completed, and the random access memory 70 is placed in use, the transfer gates 130 and 132 are continuously turned on and the weak field-effect transistors 122, 124, 126, and 128 are continuously turned off. This restores the random access memory 70 to normal operation.

As can be seen from the foregoing, the present invention provides a new and improved testing arrangement for testing field-effect transistors and more particularly for testing the cross coupled latch field-effect transistors of memory cells of random access memories. The testing circuit of the present invention not only permits faster testing of such field-effect transistors as compared to prior art methods, it additionally permits an individual defective field-effect transistor to be located. Furthermore, the testing circuitry itself may be tested prior to the testing of the field-effect transistors to ensure the integrity of the testing procedure.

While a particular embodiment of the present invention has been shown and described, modifications may be made, and it is therefor intended to cover in the appended claims all such changes and modifications which fall within the true spirit and scope of the invention.

What is claimed is:

1. A method of testing a field-effect transistor to be tested comprising the steps of:
   coupling a weak field-effect transistor of opposite type in series with said field-effect transistor to be tested, said weak field-effect transistor being configured to source less current than said field-effect transistor to be tested;
   applying a potential difference across the series coupled field-effect transistors;
   precharging the common node of the series coupled field-effect transistors to a reference potential intermediate said potential difference;
   applying coincident turn-on potentials to the series coupled field-effect transistors; and
   sensing the potential at said common node.

2. A method as defined in claim 1 wherein said reference potential is one-half said potential difference.

3. A method as defined in claim 1 wherein said field-effect transistor to be tested is a P-channel field-effect transistor, wherein said weak field-effect transistor is an N-channel field-effect transistor, and wherein said N-channel field-effect transistor is configured to source one-tenth or less current than said P-channel field-effect transistor can source.

4. A method as defined in claim 1 wherein said field-effect transistor to be tested is an N-channel field-effect transistor, wherein said weak field-effect transistor is a P-channel field-effect transistor, and wherein said P-channel field-effect transistor is configured to source one-fifth or less current than said N-channel field-effect transistor can source.

5. An arrangement for testing the operability of a field-effect transistor to be tested comprising:
   a second field-effect transistor coupled in series relation to said field-effect transistor to be tested to form a series combination of said field-effect transistors, said second field-effect transistor being opposite in type with respect to said field-effect transistor to be tested and having a lower current sourcing capability than said field-effect transistor to be tested;
   a first voltage source coupled to one of said field-effect transistors;
   a second voltage source coupled to the other one of said field-effect transistors, said first and second voltage sources providing a potential difference across said series combination of said field-effect transistors;
   means for applying coincident turn-on potentials to said field-effect transistors; and
   sensing means having a sensing input coupled between said field-effect transistor to be tested and said second field-effect transistor for sensing the potential at said sensing input when said turn-on potentials are coincidently applied to said field-effect transistors.

6. An arrangement as defined in claim 5 wherein said field-effect transistor to be tested is a P-channel field-effect transistor having a source, a drain, and a gate, wherein said second field-effect transistor is an N-channel field-effect transistor having a source, a drain, and a gate, wherein said drain of said P-channel field-effect transistor is coupled to said drain of said N-channel field-effect transistor, wherein said first voltage source is coupled to said source of said P-channel field-effect transistor, wherein said second voltage source is coupled to said source of said N-channel field-effect transistor, and wherein said first voltage source is more positive than said second voltage source.

7. An arrangement as defined in claim 6 wherein said sensing means comprises a sense amplifier including a reference input and wherein said arrangement further includes a reference voltage source for applying a reference voltage potential to said reference input.

8. An arrangement as defined in claim 7 wherein said reference voltage source provides a reference voltage of one-half said potential difference across said series combination of field-effect transistors.

9. An arrangement as defined in claim 8 wherein said P-channel field-effect transistor is configured to source at least ten times more current than said N-channel field-effect transistor.

10. An arrangement as defined in claim 8 further including charging means for precharging said sensing input to said reference voltage potential before said field-effect transistors are turned on.

11. An arrangement as defined in claim 5 wherein said field-effect transistor to be tested is an N-channel field-effect transistor having a source, a drain, and a gate, wherein said second field-effect transistor is a P-channel field-effect transistor having a source, a drain, and a gate, wherein said drain of said N-channel field-effect transistor is coupled to said drain of said P-channel field-effect transistor, wherein said first voltage source is coupled to said source of said P-channel field-effect transistor, wherein said second voltage source is coupled to said source of said N-channel field-effect transistor, and wherein said first voltage source is more positive than said second voltage source.

12. An arrangement as defined in claim 11 wherein said sensing means comprises a sense amplifier including a reference input and wherein said arrangement further includes a reference voltage source for applying a reference voltage potential to said reference input.

13. An arrangement as defined in claim 12 wherein said reference voltage source provides a reference voltage of one-half said potential difference across said series combination of field-effect transistors.

14. An arrangement as defined in claim 13 wherein said N-channel field-effect transistor is configured to source at least five times more current than said P-channel field-effect transistor.

15. An arrangement as defined in claim 13 further including charging means for precharging said sensing input to said reference voltage potential before said field-effect transistors are turned on.

16. An arrangement for testing the operability of a field-effect transistor to be tested of a memory cell within a memory cell array, said memory cell being associated with a row conductor and at least one column conductor, said field-effect transistor to be tested being coupled between a first source of fixed potential and said column conductor, said arrangement comprising:
a second source of fixed potential;
a second field-effect transistor coupled between said column conductor and said second source of fixed potential to form a series combination of said field-effect transistor to be tested and said second field-effect transistor between said first and second sources of fixed potential, said second field-effect transistor being of opposite type with respect said field-effect transistor to be tested and having a lower current sourcing capability than said field-effect transistor to be tested;
means for applying coincident turn-on potentials to said field-effect transistor to be tested and said second field-effect transistor; and
sensing means having a sensing input coupled to said column conductor between said field-effect transistor to be tested and said second field-effect transistor for sensing the potential at said sensing input when said turn-on potentials are coincidently applied to said field-effect transistors.

17. An arrangement as defined in claim 16 wherein said field-effect transistor to be tested is a P-channel field-effect transistor having a source, a drain, and a gate, wherein said second field-effect transistor is an N-channel field-effect transistor having a source, a drain, and a gate, wherein said drain of said P-channel field-effect transistor is coupled to said drain of said N-channel field-effect transistor, wherein said first voltage source is coupled to said source of said P-channel field-effect transistor, wherein said second voltage source is coupled to said source of said N-channel field-effect transistor, and wherein said first voltage source is more positive than said second voltage source.

18. An arrangement as defined in claim 17 wherein said sensing means comprises a sense amplifier including a reference input and wherein said arrangement further includes a reference voltage source for applying a reference voltage potential to said reference input.

19. An arrangement as defined in claim 18 wherein said reference voltage source provides a reference voltage of one-half the potential difference between said first and second sources of fixed potential.

20. An arrangement as defined in claim 19 wherein said P-channel field-effect transistor is configured to source at least ten times more current than said N-channel field-effect transistor.

21. An arrangement as defined in claim 19 further including charging means for precharging said sensing input to said reference voltage potential before said turn-on potentials are coincidently applied to said field-effect transistors.

22. An arrangement as defined in claim 16 wherein said field-effect transistor to be tested is an N-channel field-effect transistor having a source, a drain, and a gate, wherein said second field-effect transistor is a P-channel field-effect transistor having a source, a drain, and a gate, wherein said drain of said N-channel field-effect transistor is coupled to said drain of said P-channel field-effect transistor, wherein said first voltage source is coupled to said source of said P-channel field-effect transistor, wherein said second voltage source is coupled to said source of said N-channel field-effect transistor, and wherein said first voltage source is more positive than said second voltage source.

23. An arrangement as defined in claim 22 wherein said sensing means comprises a sense amplifier including a reference input and wherein said arrangement further includes a reference voltage source for applying a reference voltage potential to said reference input.

24. An arrangement as defined in claim 23 wherein said reference voltage source provides a reference voltage of one-half the potential difference between said first and second sources of fixed potential.

25. An arrangement as defined in claim 24 wherein said N-channel field-effect transistor is configured to source at least five times more current than said P-channel field-effect transistor.

26. An arrangement as defined in claim 24 further including charging means for precharging said sensing input to said reference voltage potential before said turn-on potentials are coincidently applied to said field-effect transistors.

27. In a memory array of the type including a plurality of memory cells arranged in rows and columns, each said memory cell being associated with a unique combination of a row conductor and a pair of first and second column conductor, each said memory cell including a cross coupled latch having first and second sides with each said side including series coupled P and N-channel field-effect transistors, and a pass transistor having a control gate coupled to the associated row conductors and being coupled between a respective one of said column conductors and the common junction of the series coupled P and N-channel field-effect transistors, an arrangement for testing the operability of said P and N-channel field-effect transistors and comprising:

sensing means associated with each said column of memory cells, said sensing means including a first input coupled to said first column conductor of said pair of column conductors and a second input coupled to said second column conductor of said pair of column conductors for sensing the potential difference between said first and second column conductors;

a first weak P-channel field-effect transistor coupled to said sensing means first input;

a first weak N-channel field-effect transistor coupled to said sensing means first input;

a second weak P-channel field-effect transistor coupled to said sensing means second input;

a second weak N-channel field-effect transistor coupled to said sensing means second input;

said weak P-channel field-effect transistors having a lower current sourcing capability than said memory cell N-channel field-effect transistors and said weak N-channel field-effect transistors having a lower current sourcing capability than said memory cell P-channel field-effect transistors;

a first transfer gate coupling said sensing means first input to said first column conductor; and a second transfer gate coupling said sensing means second input to said second column conductor.

28. An arrangement as defined in claim 27 wherein said memory cell P-channel field-effect transistors are configured to source at least ten times more current than said weak N-channel field-effect transistors.

29. An arrangement as defined in claim 27 wherein said memory cell N-channel field-effect transistors are configured to source at least five times more current than said weak P-channel field-effect transistors.

30. An arrangement as defined in claim 27 wherein said sensing means comprises a sense amplifier.

* * * * *